(12) United States Patent
Mizusawa

(10) Patent No.: US 11,205,599 B2
(45) Date of Patent: *Dec. 21, 2021

(54) EVALUATION METHOD OF SILICON EPITAXIAL WAFER

(71) Applicant: SHIN-ETSU HANDOTAI CO., LTD., Tokyo (JP)

(72) Inventor: Yasushi Mizusawa, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 83 days.

This patent is subject to a terminal disclaimer.

(21) Appl. No.: 16/751,601

(22) Filed: Jan. 24, 2020

(65) Prior Publication Data

US 2020/0161197 A1 May 21, 2020

Related U.S. Application Data

(62) Division of application No. 15/571,246, filed as application No. PCT/JP2016/001223 on Mar. 7, 2016, now Pat. No. 10,643,908.

(30) Foreign Application Priority Data

May 20, 2015 (JP) .................................. 2015-102441

(51) Int. Cl.
*H01L 21/02* (2006.01)
*H01L 21/66* (2006.01)
(Continued)

(52) U.S. Cl.
CPC .............. *H01L 22/20* (2013.01); *B07C 5/342* (2013.01); *C30B 25/20* (2013.01); *C30B 29/06* (2013.01);
(Continued)

(58) Field of Classification Search
CPC ....... B07C 5/342; C30B 25/20; H01L 21/205; H01L 22/20; G01N 21/6478; G01N 21/66; G01N 21/9505
See application file for complete search history.

(56) References Cited

U.S. PATENT DOCUMENTS 5,006,717 A * 4/1991 Tsutsu .................... G01N 21/66
250/458.1
7,481,879 B2 1/2009 Meguro et al.
(Continued)

FOREIGN PATENT DOCUMENTS

EP 2 779 220 A2 9/2014
JP H04-104042 A 4/1992
(Continued)

OTHER PUBLICATIONS

Apr. 26, 2016 International Search Report issued in International Patent Application No. PCT/JP2016/001223.

*Primary Examiner* — Joseph C Rodriguez
(74) *Attorney, Agent, or Firm* — Oliff PLC

(57) ABSTRACT

An evaluation method of a silicon epitaxial wafer, including using a photoluminescence (PL) measuring apparatus to measure a PL spectrum of the mirror wafer and adjusting the apparatus so emission intensity of a TO-line becomes 30000 to 50000 counts, irradiating the silicon epitaxial wafer with an electron beam, measuring PL spectrum from an electron beam irradiation region, and sorting out and accepting a silicon epitaxial wafer which has emission intensity resulting from a $C_iC_s$ defect of the PL spectrum being 0.83% or less of the emission intensity of the TO-line and from a $C_iO_i$ defect being 6.5% or less of the emission intensity of the TO-line.

1 Claim, 3 Drawing Sheets

(51) Int. Cl.
    *C30B 29/06*     (2006.01)
    *B07C 5/342*     (2006.01)
    *C30B 25/20*     (2006.01)
    *G01N 21/66*     (2006.01)
    *C30B 25/02*     (2006.01)
    *H01L 27/146*     (2006.01)

(52) U.S. Cl.
    CPC .............. *G01N 21/66* (2013.01); *C30B 25/02* (2013.01); *H01L 27/14687* (2013.01)

(56) References Cited

U.S. PATENT DOCUMENTS

| | | | |
|---|---|---|---|
| 7,504,642 B2* | 3/2009 | Hummel | G01N 21/6489 250/400 |
| 7,943,401 B2 | 5/2011 | Tamir-Kheli et al. | |
| 8,446,576 B2 | 5/2013 | Ito et al. | |
| 8,742,372 B2 | 6/2014 | Trupke | |
| 9,000,567 B2 | 4/2015 | Miyahara et al. | |
| 9,261,464 B2 | 2/2016 | Kreszowski et al. | |
| 9,354,177 B2* | 5/2016 | Sappey | G01N 21/9501 |
| 9,410,890 B2 | 8/2016 | Sappey | |
| 9,541,452 B2 | 1/2017 | Nakagawa et al. | |
| 9,546,955 B2 | 1/2017 | Trupke et al. | |
| 9,553,034 B1 | 1/2017 | Young et al. | |
| 9,909,986 B2 | 3/2018 | Rahman et al. | |
| 10,209,190 B2 | 2/2019 | Kiss et al. | |
| 10,643,908 B2* | 5/2020 | Mizusawa | C30B 25/20 |
| 2018/0277450 A1 | 9/2018 | Mizusawa | |

FOREIGN PATENT DOCUMENTS

| | | |
|---|---|---|
| JP | 2010-287778 A | 12/2010 |
| JP | 2013-152977 A | 8/2013 |
| JP | 2014-199253 A | 10/2014 |
| WO | 2004008119 A1 | 1/2004 |

* cited by examiner

[FIG. 1]
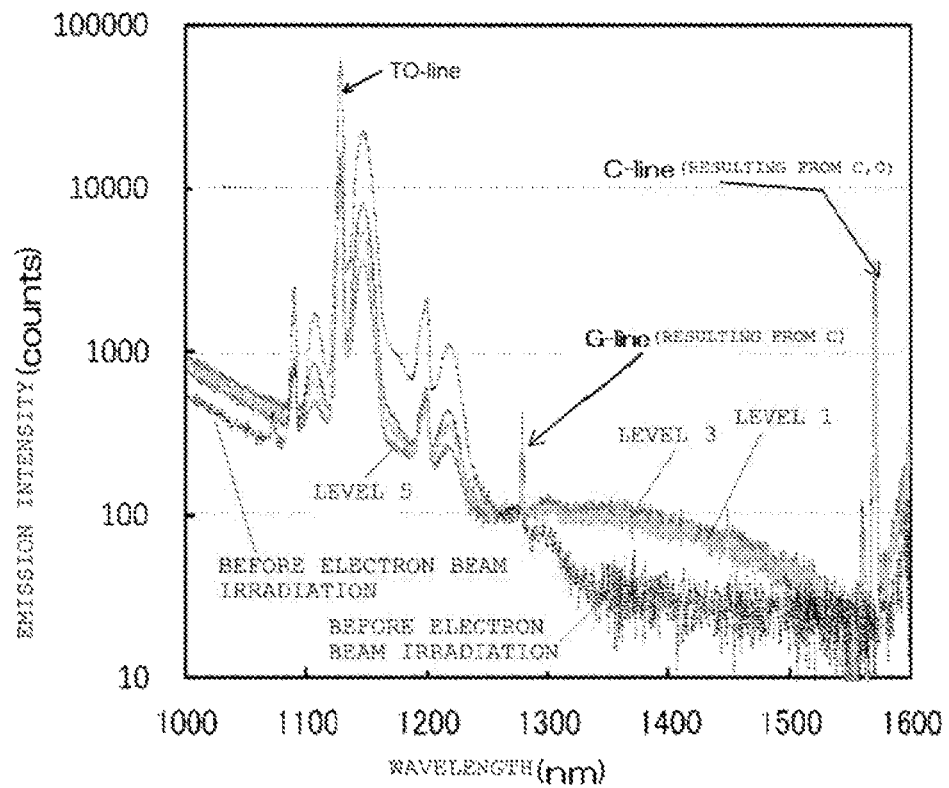
[FIG. 2A]
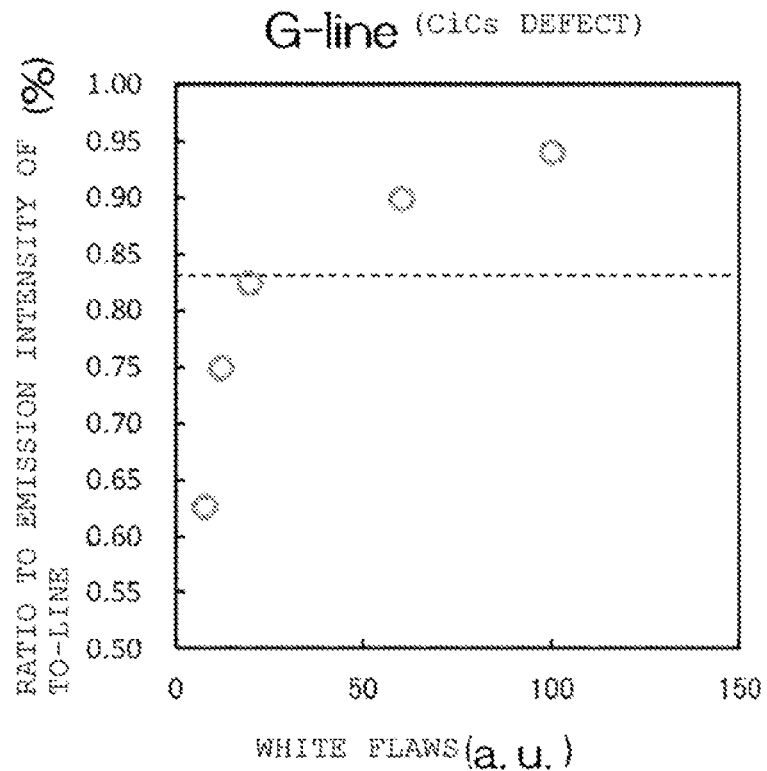

[FIG. 2B]
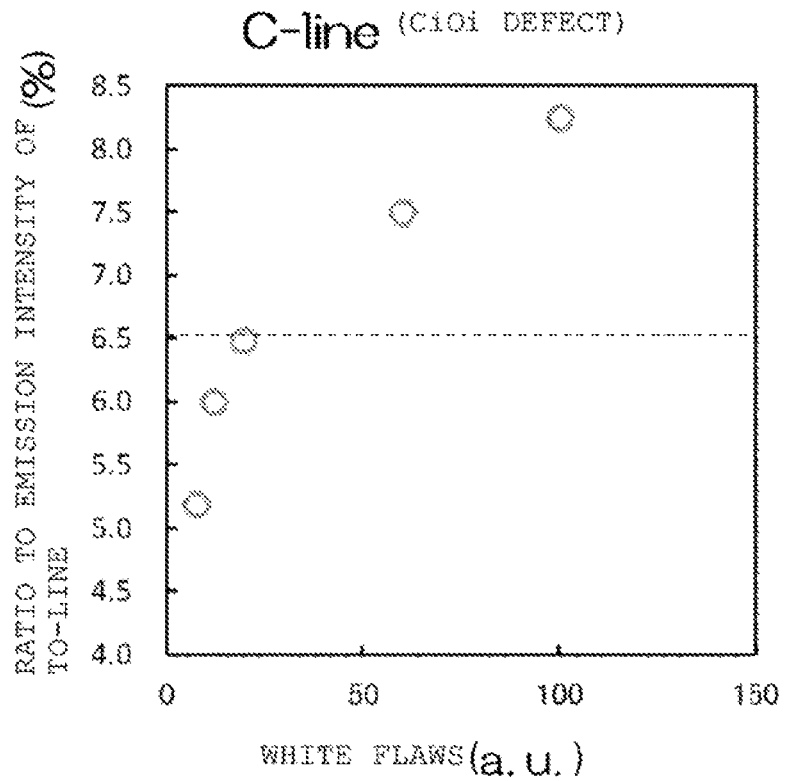
[FIG. 3]
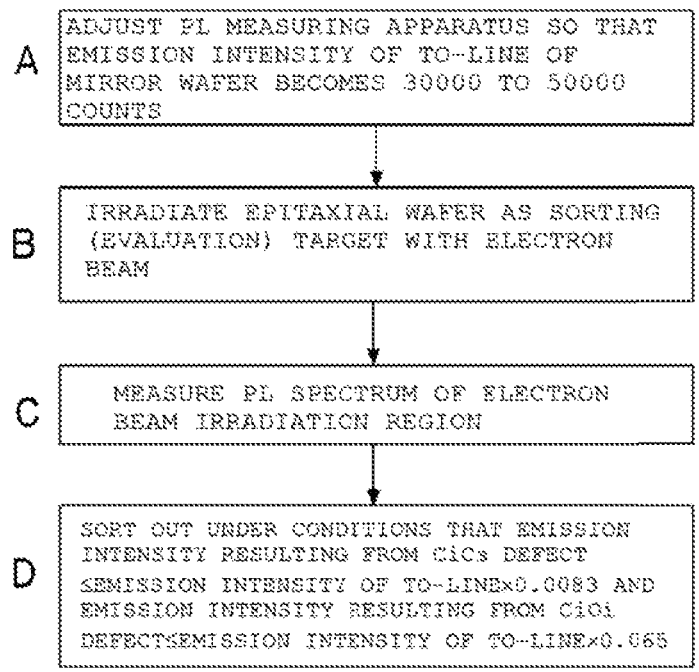

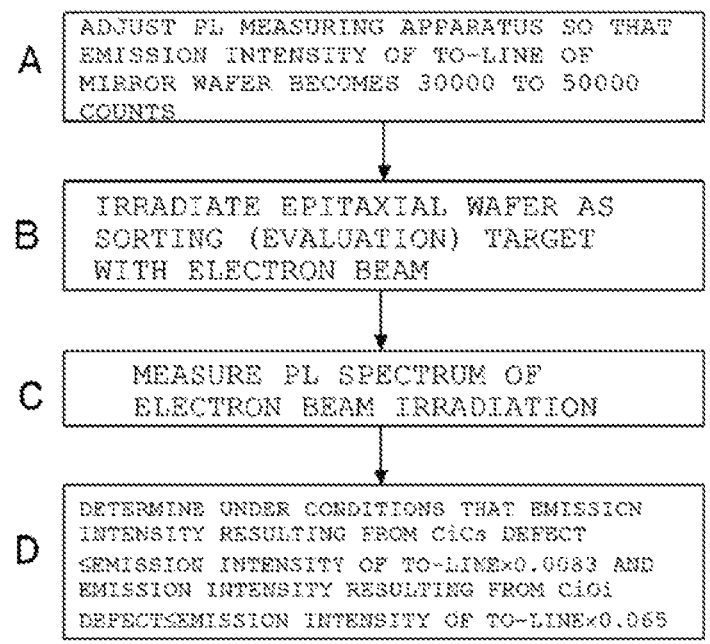
[FIG. 4]

EVALUATION METHOD OF SILICON EPITAXIAL WAFER

This is a Divisional of application Ser. No. 15/571,246 filed Nov. 1, 2017, which is a National Stage Application of PCT/JP2016/001223 filed Mar. 7, 2016, and claims the benefit of Japanese Application No. 2015-102441 filed May 20, 2015. The entire disclosures of the prior applications are hereby incorporated by reference herein in their entireties.

TECHNICAL FIELD

The present invention relates to a manufacturing method of a silicon epitaxial wafer, an imaging element manufactured by using a silicon epitaxial wafer manufactured by the manufacturing method, and an evaluation method of a silicon epitaxial wafer.

BACKGROUND ART

As a substrate for fabrication of a semiconductor integrated circuit, a silicon wafer fabricated by a CZ (Czochralski) method is mainly used. In the most advance imaging element (a CCD, a CMOS image sensor, or the like) in recent years, a dark current failure called a white flaw occurs. It is said that the white flaw occurs due to presence of any defect which forms a deep level. Specifically, there is a metal impurity. It is well known that presence of the metal impurity in a device active region causes a white flaw failure.

As any other known defect which forms a deep level, there are a $C_iC_s$ defect, a $C_iO_i$ defect, and the like. The $C_iC_s$ defect is a complex of interstitial carbon and lattice position carbon, the $C_iO_i$ defect is a complex of interstitial carbon and interstitial oxygen, and they can be a cause of a white flaw failure since they form a deep level.

CITATION LIST

Patent Literature

Patent Literature 1: Japanese Unexamined Patent Application Publication No. Hei 4-104042

DISCLOSURE OF INVENTION

Problem to be Solved by the Invention

As a substrate having has less defects which form a deep level, it is often the case that an epitaxial wafer is used for a high-sensitivity imaging element. As a cause of the white flaw failure which occurs in this case, there is a metal impurity in an epitaxial layer. As any other known defect which forms a deep level, there are the $C_iC_s$ defect, the $C_iO_i$ defect, and the like. To form the $C_iC_s$ defect, the $C_1O_1$ defect, and the like, presence of oxygen or carbon is required, and no defect is produced unless the oxygen and the carbon are present.

It has been considered that oxygen or carbon is not present in the epitaxial layer in the epitaxial wafer except oxygen or carbon which diffuses from the substrate to the epitaxial layer during a device process.

However, when an electron beam is applied immediately after growing an epitaxial layer on a silicon substrate and measurement is performed by a low-temperature photoluminescence method (which will be also referred to as a PL method hereinafter), the $C_iC_s$ defect or the $C_iO_i$ defect is detected. A measurement wavelength is 532 nm and a penetration length in silicon is approximately 1 μm in this case, the $C_iC_s$ defect or the $C_iO_i$ defect is detected even if an epitaxial wafer having the epitaxial layer which is much thicker than the penetration length is used, and hence it can be said that the oxygen or the carbon which is present immediately after the growth of the epitaxial layer does not diffuse from the substrate.

Thus, it has been revealed that a very small amount of oxygen or carbon is present in the epitaxial layer even immediately after the epitaxial growth. Therefore, to manufacture an imaging element substrate with an excellent yield rate, it is good to further reduce amounts of the oxygen and the carbon contained in the epitaxial layer.

However, it is difficult to directly accurately measure the oxygen or the carbon with extremely low concentration which affects a white flaw failure in the most advanced imaging element. As a method for precisely obtaining oxygen concentration in silicon, Patent Literature 1 discloses a method for implanting carbon ions into a silicon sample to produce a complex defect of the oxygen and the carbon and measuring photoluminescence from the silicon sample to obtain oxygen concentration. However, the carbon is implanted, and the concentration of the carbon which is present in the silicon sample from the beginning cannot be obtained.

Further, Patent Literature 1 does not have a description about the white flaw failure of the imaging element, and a relationship between the white flaw failure of the imaging element manufactured by using an epitaxial wafer and the photoluminescence concerning the oxygen in the epitaxial wafer is not clear.

In view of the above-described problem, it is an object of the present invention to provide a manufacturing method of a silicon epitaxial wafer which enables sorting out and accepting a silicon epitaxial wafer which does not bring a problem of a white flaw failure in an imaging element at the time of manufacturing the imaging element by using the silicon epitaxial wafer. Furthermore, it is another object of the present invention to provide an imaging element manufactured with the use of a silicon epitaxial wafer manufactured by the manufacturing method of a silicon epitaxial wafer. Moreover, it is still another object of the present invention to provide an evaluation method of a silicon epitaxial wafer which enables determining whether white flaw failures of an imaging element are at a negligible level at the time of manufacturing the imaging element with the use of the silicon epitaxial wafer.

It is to be noted that the □negligible level□ means that the number of white flaw failures of the imaging element is sufficiently low and no problem occurs in a product, e.g., a digital camera using this imaging element.

Means for Solving Problem

To achieve the object, the present invention provides a manufacturing method of a silicon epitaxial wafer having an epitaxial layer grown on a mirror wafer of silicon, including the steps of:

using a photoluminescence measuring apparatus to measure a spectrum of photoluminescence generated by irradiating the mirror wafer with light, and adjusting the photoluminescence measuring apparatus so that intensity of emission of a TO-line of the spectrum becomes 30000 to 50000 counts;

irradiating the silicon epitaxial wafer with an electron beam;

irradiating an electron beam irradiation region of the silicon epitaxial wafer with light, and measuring a spectrum of generated photoluminescence by the adjusted photoluminescence measuring apparatus; and sorting out and accepting a silicon epitaxial wafer which has intensity of emission resulting from a $C_iC_s$ defect of the spectrum of the photoluminescence from the silicon epitaxial wafer being 0.83% or less of the intensity of the emission of the TO-line and has intensity of emission resulting from a $C_iO_i$ defect of the same being 6.5% or less of the intensity of the emission of the TO-line.

As described above, the photoluminescence measuring apparatus is adjusted so that the intensity of the emission of a TO-line becomes 30000 to 50000 counts to the silicon epitaxial wafer fabricated by growing the epitaxial wafer, and the silicon epitaxial wafer which has the intensity of the emission resulting from the $C_iC_s$ defect of the spectrum of the photoluminescence being 0.83% or less of the intensity of the emission of the TO-line and has the intensity of the emission resulting from the $C_iO_i$ defect being 6.5% or less of the intensity of the emission of the TO-line is sorted out to manufacture the imaging element, thereby assuredly reducing white flaw failures of the imaging element to a negligible level.

It is to be noted that 30000 to 50000 counts mean 30000 counts or more and 50000 counts or less.

Further, the present invention provides an imaging element manufactured by using a silicon epitaxial wafer manufactured by the manufacturing method of a silicon epitaxial wafer.

According to such an imaging element, the white flaw failures are reduced to the negligible level.

Furthermore, to achieve the object, the present invention provides an evaluation method of a silicon epitaxial wafer having an epitaxial layer grown on a mirror wafer of silicon, including the steps of:

using a photoluminescence measuring apparatus to measure a spectrum of photoluminescence generated by irradiating the mirror wafer with light, and adjusting the photoluminescence measuring apparatus so that intensity of emission of a TO-line of the spectrum becomes 30000 to 50000 counts;

irradiating the silicon epitaxial wafer with an electron beam;

irradiating an electron beam irradiation region of the silicon epitaxial wafer with light, and measuring a spectrum of generated photoluminescence by the adjusted photoluminescence measuring apparatus;

obtaining intensity of emission resulting from a $C_iC_s$ defect of the spectrum of the photoluminescence from the silicon epitaxial wafer, and determining whether the intensity of the emission is 0.83% or less of the intensity of the emission of the TO-line; and obtaining intensity of emission resulting from a $C_iO_i$ defect of the spectrum of the photoluminescence from the silicon epitaxial wafer, and determining whether the intensity of the emission is 6.5% or less of the intensity of the emission of the TO-line.

As described above, the photoluminescence measuring apparatus is adjusted so that the intensity of the emission of the TO-line becomes 30000 to 50000 counts to the silicon epitaxial wafer fabricated by growing the epitaxial layer, and whether the intensity of the emission resulting from the $C_iC_s$ defect of the spectrum of the photoluminescence is 0.83% or less of the intensity of the emission of the TO-line and whether the intensity of the emission resulting from the $C_iO_i$ defect is 6.5% or less of the intensity of the emission of the TO-line are determined, thereby determining whether the silicon epitaxial wafer has a negligible level of white flaw failures of the imaging element without actually manufacturing the imaging element.

Effect of the Invention

As described above, according to the manufacturing method of a silicon epitaxial wafer of the present invention, when the silicon epitaxial wafer is sorted out to manufacture the imaging element, the white flaw failures of the imaging element are reduced to the negligible level, and the high-performance high-quality imaging element can be manufactured. Furthermore, according to the evaluation method of a silicon epitaxial wafer of the present invention, whether the silicon epitaxial wafer has the negligible level of the white flaw failures of the imaging element can be determined without actually manufacturing the imaging element.

BRIEF DESCRIPTION OF THE DRAWINGS

FIG. 1 is a view showing a measurement result of photoluminescence of a silicon epitaxial wafer;

FIG. 2A is a graph showing a relationship between a ratio of emission intensity resulting from a $C_iC_s$ defect to intensity of emission of a TO-line and white flaws;

FIG. 2B is a graph showing a relationship between a ratio of emission intensity resulting from a $C_iO_i$ defect to intensity of emission of a TO-line and white flaws;

FIG. 3 is a view showing a process flow of a manufacturing method of a silicon epitaxial wafer according to the present invention; and FIG. 4 is a view showing a process flow of an evaluation method of a silicon epitaxial wafer according to the present invention.

BEST MODE(S) FOR CARRYING OUT THE INVENTION

The present invention will now be described hereinafter in detail.

As described above, in silicon epitaxial wafer for the most advanced imaging element, a method for providing a silicon epitaxial wafer which realizes a negligible level of white flaw failures has been demanded.

As a result of the earnest examinations to achieve the object, the present inventor has found out that the above-described problem can be solved by a manufacturing method of a silicon epitaxial wafer having an epitaxial layer grown on a mirror wafer of silicon, including the steps of:

using a photoluminescence measuring apparatus to measure a spectrum of photoluminescence generated by irradiating the mirror wafer with light, and adjusting the photoluminescence measuring apparatus so that intensity of emission of a TO-line of the spectrum becomes 30000 to 50000 counts;

irradiating the silicon epitaxial wafer with an electron beam;

irradiating an electron beam irradiation region of the silicon epitaxial wafer with light, and measuring a spectrum of generated photoluminescence by the adjusted photoluminescence measuring apparatus; and sorting out and accepting a silicon epitaxial wafer which has intensity of emission resulting from a $C_iC_s$ defect of the spectrum of the photoluminescence from the silicon epitaxial wafer being 0.83% or less of the intensity of the emission of the TO-line and has intensity of emission resulting from a $C_iO_i$ defect of the same being 6.5% or less of the intensity of the emission of the TO-line, thereby bringing the present invention to completion.

An embodiment of the present invention will now be described hereinafter in detail with reference to the drawings, but the present invention is not restricted thereto.

First, a relationship between emission intensity of PL resulting from a $C_iC_s$ defect and a $C_iO_i$ defect of a silicon epitaxial wafer and white flaws of an imaging element manufactured by using a silicon epitaxial wafer manufactured under the same conditions as those of the former silicon epitaxial wafer was checked.

First, to manufacture a silicon epitaxial wafer having a diameter of 300 mm for an imaging element, samples each having an epitaxial film (layer) having a resistivity of 10 Ω·cm and a thickness of 10 μm formed on a mirror wafer of n-type silicon having a resistivity of 10 Ω·cm were prepared. As epitaxial layer growth conditions in this example, five levels (Levels 1, 2, 3, 4, and 5) were set. These five levels are based on manufacturing conditions which are considered to produce a difference in concentration of oxygen taken in during epitaxial growth. Imaging elements were actually manufactured by using these samples, and dark current (white flaw) characteristics were examined.

Subsequently, a silicon epitaxial wafer was manufactured under the same growth conditions as the five levels, then electron beams were applied to it, and PL spectrums in an electron beam irradiation region were measured. FIG. 1 shows spectrums (Levels 1, 3, and 5) as measurement results. Further, PL spectrums from the silicon epitaxial wafer before applying the electron beams were also measured and shown in FIG. 1. As the PL spectrums before applying the electron beams, those starting from Level 1 are shown, but the PL spectrums on the other levels are similar spectrums.

In FIG. 1, light emission with the highest intensity near a wavelength of 1130 nm corresponds to a TO-line, and this is based on interband transition emission to which TO (Transverse Optical) phonons relate. Moreover, light emission near a wavelength of 1278 nm corresponds to a G-line, and it is light emission resulting from a $C_iC_s$ defect. Additionally, light emission near a wavelength of 1571 nm corresponds to a C-line, and it is light emission resulting from a $C_iO_i$ defect. Comparing the PL spectrums before applying the electron beams, in all of the PL spectrums of Levels 1 to 5, the light emission of the G-line and that of the C-line are strong, and levels resulting from the $C_iO_i$ defect and the $C_iC_s$ defect were detected.

In the G-line in FIG. 1, Level 5 has the largest emission intensity, Level 1 has the smallest emission intensity, and the emission intensity increases in the order of Levels 1 to 5. Further, In the C-line, like the G-line, Level 5 has the largest emission intensity, Level 1 has the smallest emission intensity, and the emission intensity increases in the order of Levels 1 to 5.

Here, the PL measuring apparatus was adjusted so that the intensity of emission of the TO-line on a mirror wafer as a reference has 30000 to 50000 counts, and the emission intensity of the G-line and that of the C-line which were used in the subsequent example were obtained from wafers on respective levels. When the intensity of the light emission of the TO-line is less than 30000 counts, the emission intensity of the G-line and that of the C-line are small, and highly precise evaluation of the white flaws cannot be performed. Furthermore, when the intensity of the emission of the TO-line exceeds 50000 counts, the emission intensity of the G-line and that of the C-line are too large, and a correlation with the white flaws cannot be provided.

Moreover, FIG. 2A shows a relationship between the already checked white flaws of the imaging element and the intensity of the emission (the G-line) resulting from the $C_iC_s$ defect, and FIG. 2B shows a relationship between the white flaws of the imaging element and the intensity of the emission (the C-line) resulting from the $C_iO_i$ defect. In each of FIG. 2A and FIG. 2B, an axis of abscissa represents the number of the white flaws, and an axis of ordinate represents a ratio of the light emission result from the $C_iC_s$ defect or the $C_1O_1$ defect to the intensity of the emission of the TO-line. It is to be noted that the number of the white flaws of the imaging element is also dependent on an area of an imaging surface, and hence the number of the white flaws in each of FIG. 2A and FIG. 2B is standardized.

In FIG. 2A, Level 1 has the smallest number of the white flaws, Level 5 has the largest number of the white flaws, and the number of the white flaws increases in the order of Levels 1 to 5. In FIG. 2B, likewise, Level 1 has the smallest number of the white flaws, and Level 5 has the largest number of the white flaws. It has been revealed from these facts that white flaw characteristics are degraded as the emission intensity of the G-line resulting from the $C_iC_s$ defect or the emission intensity of the C-line resulting from the $C_iO_i$ defect increases.

Here, as to the G-line, when the emission intensity exceeds 0.83% of the emission intensity of the TO-line, the white flaw characteristics are precipitously degraded. On the other hand, as to the C-line, when the emission intensity exceeds 6.5% of the emission intensity of the TO-line, the white flaw characteristics are precipitously degraded. The number of the white flaws is estimated as 18 when the emission intensity of the G-line is 0.83% of the emission intensity of the TO-line, and the number of the white flaws is estimated as 18 when the emission intensity of the C-line is 6.5% of the emission intensity of the TO-line. These numbers are actually at a negligible level even in the most advanced imaging element. Thus, when a silicon epitaxial wafer which has the emission intensity of the G-line being 0.83% or less of the emission intensity of the TO-line and the emission intensity of the C-line being 6.5% or less of the emission intensity of the TO-line is used to manufacture the imaging element, the white flaw failures can be suppressed to a negligible level.

Furthermore, both a ratio of the emission intensity of the G-line to the emission intensity of the TO-line and a ratio of the emission intensity of the C-line to the emission intensity of the TO-line could be 0% or more.

A manufacturing method of a silicon epitaxial wafer according to the present invention will now be described with reference to FIG. 3.

FIG. 3 is a view showing a process flow of the manufacturing method of a silicon epitaxial wafer according to the present invention. First, in the present invention, a mirror wafer of silicon which serves as a reference is irradiated with light, and a generated PL spectrum is measured by the PL measuring apparatus. Although the light which is applied to the mirror wafer is not restricted in particular, it can be, e.g., a solid-state laser having a wavelength of 532 nm. Besides, an Ar ion laser, a He—Cd laser, or the like can be used. Moreover, the PL measuring apparatus is adjusted so that emission intensity of a TO-line of the resultant PL spectrum becomes 30000 to 50000 counts (a step A).

At this time, the mirror wafer of the silicon which serves as the reference is not restricted in particular, but it is preferable to always used the same mirror wafer for a long time so that variations in emission intensity measurement value does not occur depending on measurement timing. Additionally, the mirror wafer as the reference may be determined in accordance with each specification of the epitaxial wafer. Even in this case, it is preferable to use the same mirror wafer for a long time in accordance with each specification.

Then, an electron beam is applied to the silicon epitaxial wafer as a sorting target (a step B) so that a $C_iC_s$ defect or a $C_iO_i$ defect is produced in an epitaxial layer. Although an apparatus which applies the electron beam is not restricted in particular, for example, an apparatus like a scanning electron microscope can be used. Although the electron beam can be applied to all epitaxial wafers as sorting targets, for example, when it can be presumed that emission intensity of a G-line and that of a C-line do not differ among 20 epitaxial wafers continuously grown by the same epitaxial growth apparatus, the electron beam may be applied to only one of the 20 epitaxial wafers.

Subsequently, an electron beam irradiation region of each silicon epitaxial wafer is irradiated with light, and a generated PL spectrum is measured by the adjusted PL measuring apparatus (a step C), whereby the emission intensity of the G-line and that of the C-line are obtained.

Moreover, when the emission intensity of the G-line resulting from the $C_iC_s$ defect is 0.83% or less of the emission intensity of the TO-line and the emission intensity of the C-line resulting from the $C_1O_1$ defect is 6.5% or less of the emission intensity of the TO-line, this silicon epitaxial wafer is determined to be acceptable (a step D). Additionally, as described above, for example, when it has been known that the emission intensity of the G-line and that of the C-line do not differ among the 20 wafers including this silicon epitaxial wafer, the remaining 19 silicon epitaxial wafers can be also determined to be acceptable.

Each silicon epitaxial wafer sorted out and determined to be acceptable in this manner is used to manufacture an imaging element. Then, this imaging element has a considerably reduced number of white flaw failures, which is a practically negligible level.

Further, an evaluation method of a silicon epitaxial wafer according to the present invention will now be described with reference to FIG. 4.

The evaluation method of a silicon epitaxial wafer according to the present invention has a step (a step A) of measuring a PL spectrum by using a mirror wafer of silicon and adjusting the PL measuring apparatus so that emission intensity of the TO-line becomes 30000 to 50000 counts, a step (a step B) of irradiating an epitaxial wafer as an evaluation target with an electron beam, and a step (a step C) of measuring the PL spectrum in this electron beam irradiation region, and these steps are the same as those of the manufacturing method of a silicon epitaxial wafer for sorting out a silicon epitaxial wafer and determining the same to be acceptable which has been described above.

The evaluation method of a silicon epitaxial wafer according to the present invention further has a step of determining whether emission intensity of a G-line resulting from a $C_iC_s$ defect of the PL spectrum from the silicon epitaxial wafer as the evaluation target is 0.83% or less of the emission intensity of the TO-line, and a step of determining whether emission intensity of a C-line resulting from a $C_iO_i$ defect of the same is 6.5% or less of the emission intensity of the TO-line.

According to the evaluation method of a silicon epitaxial wafer of the present invention, it is possible to evaluate whether the manufactured silicon epitaxial wafer is appropriate as a wafer for an imaging element. Specifically, it is possible to detailedly obtain a range of growth conditions for an epitaxial layer for manufacture of a silicon epitaxial wafer suitable for an imaging element by using the evaluation method of a silicon epitaxial wafer of the present invention.

EXAMPLES

The present invention will now be described hereinafter in detail with reference to examples, but the present invention is not restricted thereto.

Example 1

To manufacture silicon epitaxial wafers each having a diameter of 300 mm for an imaging element, five wafers each having an epitaxial layer with a resistivity of 10 Ω·cm and a thickness of 10 μm formed on a mirror wafer of n-type silicon with a resistivity of 10 Ω·cm were prepared. The five wafers were provided by continuously growing the epitaxial layers under the same growth conditions by using the same epitaxial growth apparatus, and the epitaxial layers of the five wafers are homogeneous.

Then, the mirror wafer of silicon was used to adjust a PL measuring apparatus so that emission intensity of a TO-line became 40000 counts.

Furthermore, one of the prepared silicon epitaxial wafers was irradiated with an electron beam. Subsequently, a PL spectrum in an electron beam irradiation region of this wafer was measure by the adjusted PL measuring apparatus. Emission intensity of a G-line at that moment was 0.63% of emission intensity of the TO-line, and emission intensity of a C-line was 5.2% of the emission intensity of the TO-line, and they met sorting conditions.

On the other hand, imaging elements were manufactured by using the remaining four silicon epitaxial wafers, and evaluation of white flaw failures was performed. An average value of the numbers of the white flaws of the manufactured imaging elements was four, and the imaging elements with the extremely reduced numbers of the white flaw failures were manufactured.

Example 2

Like Example 1, five wafers each having an epitaxial layer with a resistivity of 10 Ω·cm and a thickness of 10 μm formed on a mirror wafer of n-type silicon with a diameter of 300 mm and a resistivity of 10 Ω·cm were prepared. However, an epitaxial growth apparatus used for epitaxial growth was an apparatus different from that in Example 1. Moreover, a mirror wafer of silicon was used to adjust a PL measuring apparatus so that emission intensity of a TO-line became 40000 counts.

Additionally, one of the prepared silicon epitaxial wafers was irradiated with an electron beam, and a PL spectrum of an electron beam irradiation region of this wafer was measured by the adjusted PL measuring apparatus. Emission intensity of a G-line at that moment was 0.94% of the emission intensity of the TO-line, and emission intensity of a C-line was 8.3% of the emission intensity of the TO-line, and they did not meet sorting (evaluation) conditions.

Additionally, imaging elements were manufactured by using the remaining four silicon epitaxial wafers, and evaluation of white flaw failures was performed. Presence of many white flaws was estimated from the evaluation of the emission intensity of the G-line and that of the C-line, and an average value of the number of the white flaws of the actually manufactured imaging elements was as large as 102. This was an inappropriate level for the most advanced imaging element.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

The invention claimed is:

1. An evaluation method of a silicon epitaxial wafer having an epitaxial layer grown on a mirror wafer of silicon, comprising the steps of:

using a photoluminescence measuring apparatus to measure a spectrum of photoluminescence generated by irradiating the mirror wafer with light, and adjusting the photoluminescence measuring apparatus so that intensity of emission of a TO-line of the spectrum becomes 30000 to 50000 counts, the TO-line corresponding to light emission with the highest intensity near a wavelength of 1130 nm of the spectrum;

irradiating the silicon epitaxial wafer with an electron beam;

irradiating an electron beam irradiation region of the silicon epitaxial wafer with light, and measuring a spectrum of generated photoluminescence by the adjusted photoluminescence measuring apparatus;

obtaining intensity of emission resulting from a $C_iC_s$ defect of the spectrum of the photoluminescence from the silicon epitaxial wafer, and determining whether the intensity of the emission is 0.83% or less of the intensity of the emission of the TO-line; and obtaining intensity of emission resulting from a $C_iO_i$ defect of the spectrum of the photoluminescence from the silicon epitaxial wafer, and determining whether the intensity of the emission is 6.5% or less of the intensity of the emission of the TO-line.

* * * * *